(12) United States Patent
Harada et al.

(10) Patent No.: US 6,642,875 B2
(45) Date of Patent: Nov. 4, 2003

(54) PWM CONVERTING CIRCUIT, D/A CONVERTER AND PWM CONVERTING METHOD WITH IMPROVED RESOLUTION

(75) Inventors: Hiroyuki Harada, Tokyo (JP); Masako Arizumi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/166,410

(22) Filed: Jun. 11, 2002

(65) Prior Publication Data

US 2003/0117300 A1 Jun. 26, 2003

(30) Foreign Application Priority Data

Dec. 26, 2001 (JP) ........................................ 2001-394779

(51) Int. Cl.$^7$ ................................................. H03M 1/66
(52) U.S. Cl. ....................................... 341/144; 341/143
(58) Field of Search ................................ 341/144, 126, 341/143

(56) References Cited

U.S. PATENT DOCUMENTS 5,724,039 A * 3/1998 Hayashi ...................... 341/144

5,784,017 A * 7/1998 Craven ........................ 341/126

FOREIGN PATENT DOCUMENTS

| JP | 7-321661 | 12/1995 |
|---|---|---|
| JP | 9-252252 | 9/1997 |

* cited by examiner

Primary Examiner—Jean Bruner JeanGlaude
(74) Attorney, Agent, or Firm—Leydig, Voit & Mayer, LTD

(57) ABSTRACT

A pulse width modulation (PWM) converting circuit includes a pulse generator for generating two pulse signals for each bit of a basic clock pulse train, in response to the value of digital input data, and a differential amplifier for outputting a differential amplification component between the two pulse signals as a PWM signal. The pulse generator varies pulse width of a first of the two pulse signals, on a bit-by-bit basis, of the basic clock pulse train, in response to the value of the digital input data, and holds a level of a second of the two pulse signals throughout all of the bits of the basic clock pulse train, within the period of the pulse of the PWM signal.

10 Claims, 9 Drawing Sheets

| PW | P | N |
|---|---|---|
| +8 | HHHHHHHH | LLLLLLLL |
| +7 | HHHHHHHL | LLLLLLLL |
| +6 | HHHHHHLL | LLLLLLLL |
| +5 | HHHHHLLL | LLLLLLLL |
| +4 | HHHHLLLL | LLLLLLLL |
| +3 | HHHLLLLL | LLLLLLLL |
| +2 | HHLLLLLL | LLLLLLLL |
| +1 | HLLLLLLL | LLLLLLLL |
| 0 | HHHHHHHH | HHHHHHHH |
| -1 | HHHHHHHL | HHHHHHHH |
| -2 | HHHHHHLL | HHHHHHHH |
| -3 | HHHHHLLL | HHHHHHHH |
| -4 | HHHHLLLL | HHHHHHHH |
| -5 | HHHLLLLL | HHHHHHHH |
| -6 | HHLLLLLL | HHHHHHHH |
| -7 | HLLLLLLL | HHHHHHHH |
| -8 | LLLLLLLL | HHHHHHHH |

| PW | P (5A) | N (5A) | P (5B) | N (5B) | P (5C) | N (5C) | P (5D) | N (5D) |
|---|---|---|---|---|---|---|---|---|
| +8 | HHHHHHH | LLLLLLL | HHHHHHH | LLLLLLL | HHHHHHH | LLLLLLL | HHHHHHH | LLLLLLL |
| +7 | HHHHHHL | LLLLLLL | HHHHHHH | HLLLLLL | HHHHHHL | LLLLLLL | HHHHHHH | HLLLLLL |
| +6 | HHHHHLL | LLLLLLL | HHHHHHH | HHLLLLL | HHHHHLL | LLLLLLL | HHHHHHH | HHLLLLL |
| +5 | HHHHLLL | LLLLLLL | HHHHHHH | HHHLLLL | HHHHLLL | LLLLLLL | HHHHHHH | HHHLLLL |
| +4 | HHHLLLL | LLLLLLL | HHHHHHH | HHHHLLL | HHHLLLL | LLLLLLL | HHHHHHH | HHHHLLL |
| +3 | HHLLLLL | LLLLLLL | HHHHHHH | HHHHHLL | HHLLLLL | LLLLLLL | HHHHHHH | HHHHHLL |
| +2 | HLLLLLL | LLLLLLL | HHHHHHH | HHHHHHL | HLLLLLL | LLLLLLL | HHHHHHH | HHHHHHL |
| +1 | LLLLLLL | LLLLLLL | HHHHHHH | HHHHHHH | LLLLLLL | LLLLLLL | HHHHHHH | HHHHHHH |
| 0 | HHHHHHH | HHHHHHH | HHHHHHH | HHHHHHH | LLLLLLL | LLLLLLL | LLLLLLL | LLLLLLL |
| -1 | HHHHHHL | HHHHHHH | HHHHHHL | HHHHHHH | LLLLLLL | HLLLLLL | LLLLLLL | HLLLLLL |
| -2 | HHHHHLL | HHHHHHH | HHHHLLL | HHHHHHH | LLLLLLL | HHLLLLL | LLLLLLL | HHLLLLL |
| -3 | HHHHLLL | HHHHHHH | HHHLLLL | HHHHHHH | LLLLLLL | HHHLLLL | LLLLLLL | HHHLLLL |
| -4 | HHHLLLL | HHHHHHH | HHLLLLL | HHHHHHH | LLLLLLL | HHHHLLL | LLLLLLL | HHHHLLL |
| -5 | HHLLLLL | HHHHHHH | HHLLLLL | HHHHHHH | LLLLLLL | HHHHHLL | LLLLLLL | HHHHHLL |
| -6 | HLLLLLL | HHHHHHH | HLLLLLL | HHHHHHH | LLLLLLL | HHHHHHL | LLLLLLL | HHHHHHL |
| -7 | LLLLLLL | HHHHHHH | LLLLLLL | HHHHHHH | LLLLLLL | HHHHHHH | LLLLLLL | HHHHHHL |
| -8 | LLLLLLL | HHHHHHH | LLLLLLL | HHHHHHH | LLLLLLL | HHHHHHH | LLLLLLL | HHHHHHH |

| PW | FIG.8A P | FIG.8A N | FIG.8B P | FIG.8B N | FIG.8C P | FIG.8C N | FIG.8D P | FIG.8D N |
|---|---|---|---|---|---|---|---|---|
| +8 | HHHHHHHL | LLLLLLLL | HHHHHHHH | LLLLLLLL | HHHHHHHH | LLLLLLLL | HHHHHHHH | LLLLLLLL |
| +7 | LHHHHHHH | LLLLLLLL | HHHHHHHH | HLLLLLLL | LHHHHHHH | LLLLLLLL | HHHHHHHH | HLLLLLLL |
| +6 | LHHHHHHL | LLLLLLLL | HHHHHHHH | HLLLLLLH | LHHHHHHL | LLLLLLLL | HHHHHHHH | HLLLLLLH |
| +5 | LLHHHHHL | LLLLLLLL | HHHHHHHH | HHLLLLLH | LLHHHHLL | LLLLLLLL | HHHHHHHH | HHLLLLLH |
| +4 | LLHHHHLL | LLLLLLLL | HHHHHHHH | HHLLLLHH | LLLHHHLL | LLLLLLLL | HHHHHHHH | HHHLLLHH |
| +3 | LLLHHHLL | LLLLLLLL | HHHHHHHH | HHHLLLHH | LLLHHLLL | LLLLLLLL | HHHHHHHH | HHHLLLHH |
| +2 | LLLLHHLL | LLLLLLLL | HHHHHHHH | HHHLLLHH | LLLLHLLL | LLLLLLLL | HHHHHHHH | HHHHLLHH |
| +1 | LLLLLHLL | LLLLLLLL | HHHHHHHH | HHHHLLHH | LLLLLLLL | LLLLLLLL | HHHHHHHH | HHHHLLHH |
| 0 | LLLLLLLL | LLLLLLLL | HHHHHHHH | HHHHHHHH | LLLLLLLL | LLLLLLLL | LLLLLLLL | LLLLLLLL |
| -1 | HHHHHHHH | HHHHHHHH | HHHHHLHH | HHHHHHHH | LLLLLLLL | LLLLHLLL | LLLLLLLL | LLLLHLLL |
| -2 | HHHLLHHH | HHHHHHHH | HHHHLLHH | HHHHHHHH | LLLLLLLL | LLLHHHLL | LLLLLLLL | LLLHHHLL |
| -3 | HHHLLLLH | HHHHHHHH | HHHHLLLH | HHHHHHHH | LLLLLLLL | LLHHHHLL | LLLLLLLL | LLHHHHLL |
| -4 | HHHLLLLH | HHHHHHHH | HHHLLLHH | HHHHHHHH | LLLLLLLL | LLLHHHHL | LLLLLLLL | LLLHHHHL |
| -5 | HHLLLLLH | HHHHHHHH | HHLLLLLH | HHHHHHHH | LLLLLLLL | LHHHHHHL | LLLLLLLL | LHHHHHHL |
| -6 | HLLLLLLH | HHHHHHHH | HLLLLLLH | HHHHHHHH | LLLLLLLL | LHHHHHHL | LLLLLLLL | LHHHHHHL |
| -7 | HLLLLLLL | HHHHHHHH | LLLLLLLL | HHHHHHHH | LLLLLLLL | LHHHHHHH | LLLLLLLL | LHHHHHHH |
| -8 | LLLLLLLL | HHHHHHHH | LLLLLLLL | HHHHHHHH | LLLLLLLL | HHHHHHHH | LLLLLLLL | HHHHHHHH |

PWM CONVERTING CIRCUIT, D/A CONVERTER AND PWM CONVERTING METHOD WITH IMPROVED RESOLUTION

BACKGROUND OF THE INVENTION

1. Field of the Invention

The present invention relates to a PWM converting circuit and PWM converting method for differentially amplifying two pulse signals and outputting a PWM (Pulse Width Modulation) signal. Furthermore, the present invention relates to a digital-to-analog (D/A) converter using the PWM converting circuit.

2. Description of Related Art

Figure 10:
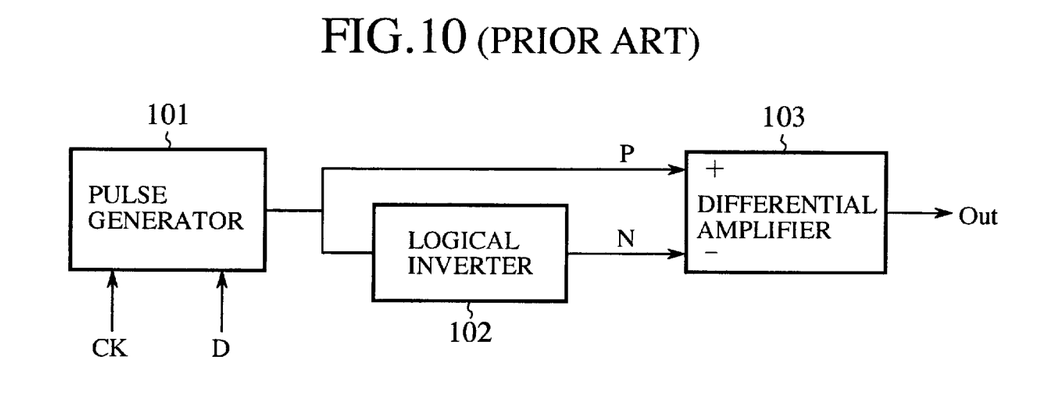
FIG. 10 is a block diagram showing a configuration of a conventional PWM converting circuit.
Figure 11A:
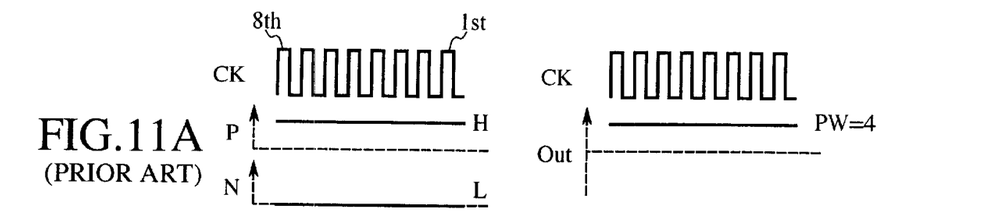
FIGS. 11(a)–11(i) are diagrams illustrating relationships between the basic clock pulse train CK, pulse signals P and N, and PWM signal Out of the PWM converting circuit in FIG. 10.
Figure 11B:
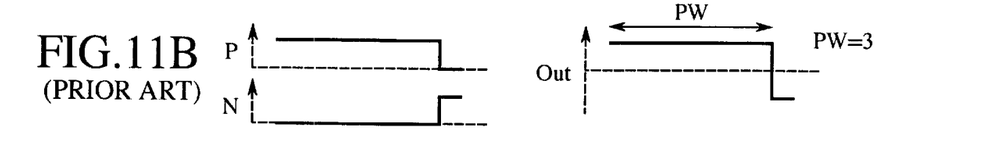
Figure 11C:
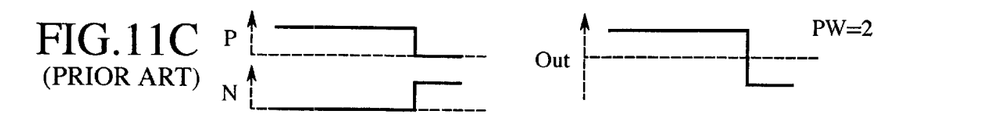
Figure 11D:
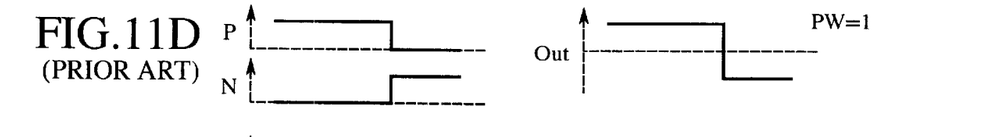
Figure 11E:
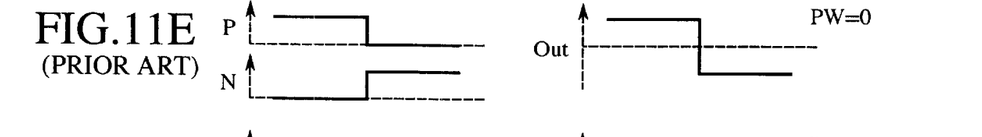
Figure 11F:
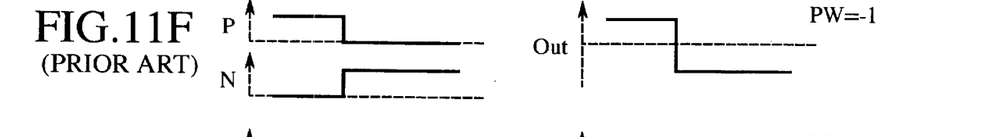
Figure 11G:
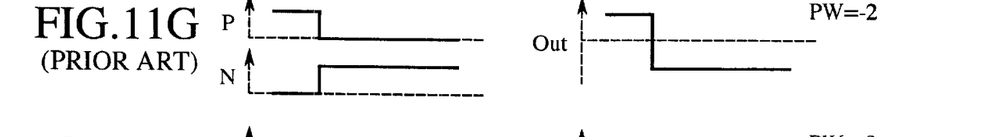
Figure 11H:
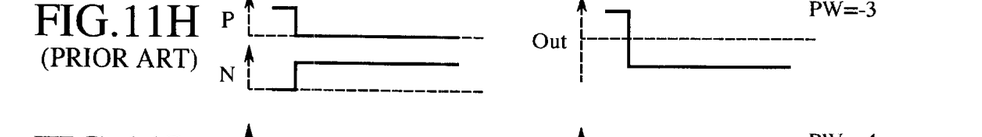
Figure 11I:
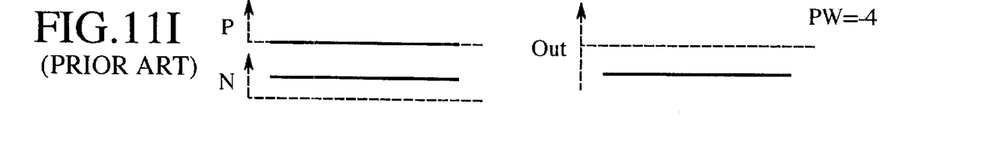

FIG. 10 is a block diagram showing a configuration of a conventional PWM converting circuit.

In FIG. 10, the reference numeral 101 designates a pulse generator for generating a pulse signal P taking either a low or high level for each pulse of a basic clock pulse train CK in response to the value of the digital data D; 102 designates a logical inverter for inverting the logical level of the pulse signal P supplied from the pulse generator 101, and for outputting a pulse signal N; and 103 designates a differential amplifier for producing a differential amplification component between the pulse signals P and N as a PWM signal.

Next, the operation of the conventional PWM converting circuit will be described.

The pulse generator 101 outputs the pulse signal P in response to the value of the digital data D. The logical inverter 102 carries out the logical inversion of the pulse signal P, and outputs the pulse signal N. The pulse signal P from the pulse generator 101 and the pulse signal N from the logical inverter 102 are supplied to the non-inverting input terminal (+) and inverting input terminal (−) of the differential amplifier 103 consisting of an operational amplifier, respectively. Thus, the differential amplifier 103 outputs the differential amplification component between the two inputs as a PWM signal Out. Subsequently, the PWM signal Out undergoes waveform shaping by a low-pass filter (not shown) to be converted into an analog D/A converted signal.

FIG. 11 illustrates relationships between the basic clock pulse train CK, pulse signals P and N and PWM signal Out of the PWM converting circuit in FIG. 10. In FIG. 11, the total number of pulses (bits) of the basic clock pulse train CK in one period of the PWM output pulse is assumed to be eight.

As shown on the left half of FIGS. 11(a)–11(i), the pulse width (the number of high-level bits) of the pulse signal P varies, on a bit-by-bit basis, the basic clock pulse train CK in response to the value of the digital data D. Since the total number n of the pulses of the basic clock pulse train CK in one period of the PWM output pulse is eight here, the pulse signal P has nine patterns. The pulse signal N, on the other hand, has waveforms reversed in the level to those of the pulse signal P through the logical inverter 102.

Thus, as illustrated in the right half of FIGS. 11(a)–11(i), the pulse width PW of the PWM signal Out the differential amplifier 103 varies from +4 to −4, providing nine patterns of the PWM signal Out, at the maximum. Generally, the conventional PWM converting circuit generates n+1 patterns of the PWM signal out for the total number n of the pulses of the basic clock pulse train CK in one period of the PWM output pulse.

With the foregoing configuration, the conventional PWM converting circuit has a problem of being unable to increase its dynamic range because of its limited output resolution. This is because the number of the output patterns of the PWM signal is limited to n+1, at the maximum, for the total bit number n of the basic clock pulse train in one period of the PWM output pulse.

SUMMARY OF THE INVENTION

The present invention is implemented to solve the foregoing problem. It is therefore an object of the present invention to provide a PWM converting circuit and PWM converting method, and a D/A converter capable of improving the output resolution and dynamic range by increasing the number of output patterns of the PWM signal for the total bit number n of the basic clock pulse train in one period of the PWM output pulse.

According to a first aspect of the present invention, there is provided a PWM converting circuit including a pulse generator for generating two pulse signals, which pulse generator varies a pulse width of one of the two pulse signals on a bit-by-bit basis of a basic clock pulse train in response to the value of digital input data, and holds a level of the other of the two pulse signals throughout a predetermined number of bits of the basic clock pulse train. It can increase the number of patterns of the PWM signal for the predetermined number of bits of the basic clock pulse train, thereby offering an advantage of being able to improve the resolution and dynamic range of the PWM signal.

According to a second aspect of the present invention, there is provided a D/A converter including the foregoing PWM converting circuit and a low-pass filter for carrying out waveform shaping of the PWM signal. It offers an advantage of being able to provide a D/A converter with improved dynamic range.

According to a third aspect of the present invention, there is provided a PWM converting method that generates two pulse signals, varies a pulse width of one of the two pulse signals on a bit-by-bit basis of a basic clock pulse train in response to the value of digital input data, and holds a level of the other of the two pulse signals throughout a predetermined number of bits of the basic clock pulse train.

DETAILED DESCRIPTION OF THE PREFERRED EMBODIMENTS

The invention will now be described with reference to the accompanying drawings.

Embodiment 1

Figure 1:
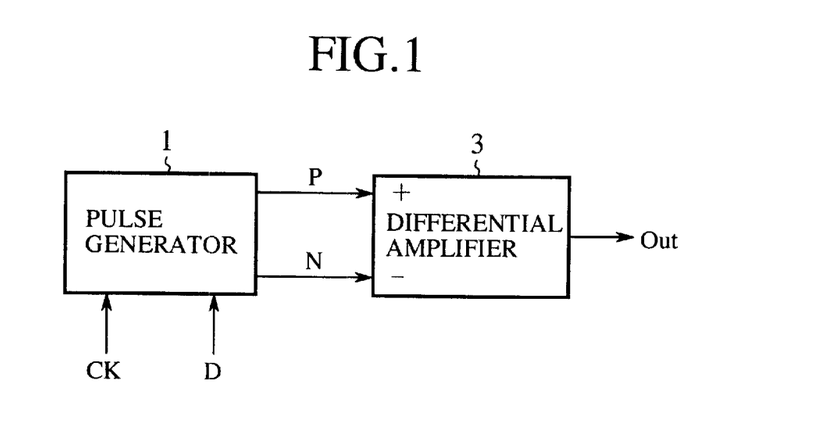
FIG. 1 is a block diagram showing a configuration of an embodiment 1 of the PWM converting circuit in accordance with the present invention.

FIG. 1 is a block diagram showing a configuration of an embodiment 1 of the PWM converting circuit in accordance with the present invention. Incidentally, the following embodiments 2–5 have the same block diagram as the present embodiment 1 shown in FIG. 1.

In FIG. 1, the reference numeral 1 designates a pulse generator for generating pulse signals P and N, each of which takes either a low or high level for each pulse of a basic clock pulse train CK in response to the value of input digital data D; and 3 designates a differential amplifier for producing a differential amplification component between the pulse signals P and N as a PWM signal.

Next, the operation of the present embodiment 1 of the PWM converting circuit will be described.

The pulse generator 1 outputs the pulse signals P and N in response to the value of the digital data D. The pulse signals P and N from the pulse generator 1 are supplied to the non-inverting input terminal (+) and inverting input terminal (−) of the differential amplifier 3 consisting of an operational amplifier, respectively. Thus, the differential amplifier 3 outputs the differential amplification component between the two inputs as the PWM signal Out. Subsequently, the PWM signal Out undergoes waveform shaping by a low-pass filter (not shown) to be converted into an analog D/A converted signal.

Figure 2:
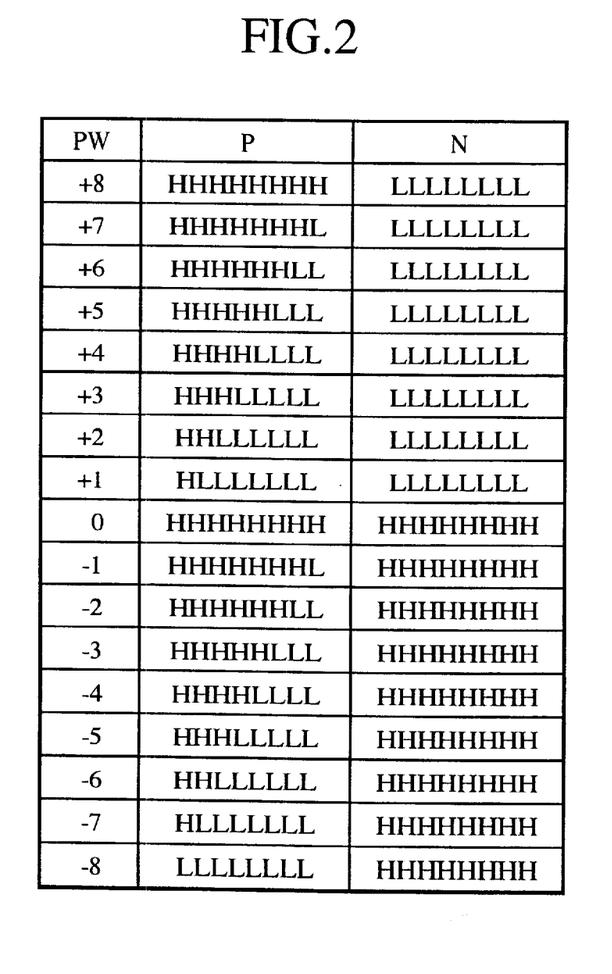
FIG. 2 is a table showing an example of the patterns of the pulse signals P and N in the PWM converting circuit of FIG. 1.
Figure 3A:
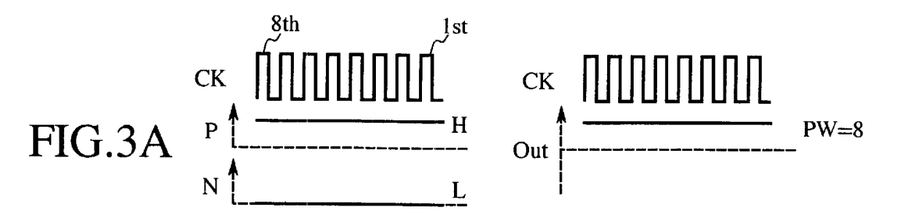
FIGS. 3(a)–3(i) are diagrams illustrating relationships between the basic clock pulse train CK, pulse signals P and N and PWM signal Out in the PWM converting circuit of FIG. 1.
Figure 3B:
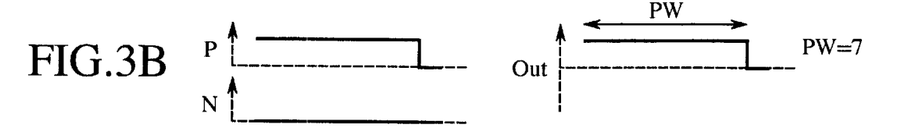
Figure 3C:
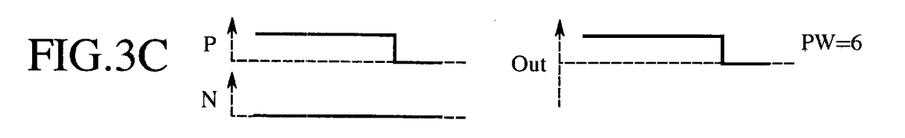
Figure 3D:
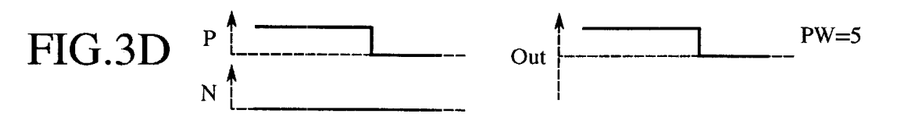
Figure 3E:
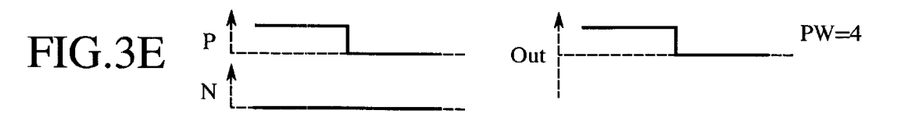
Figure 3F:
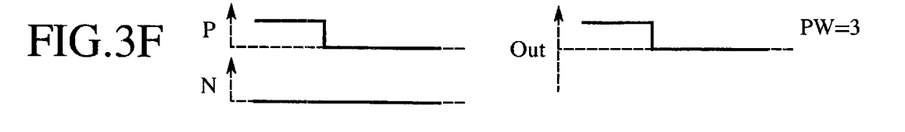
Figure 3G:
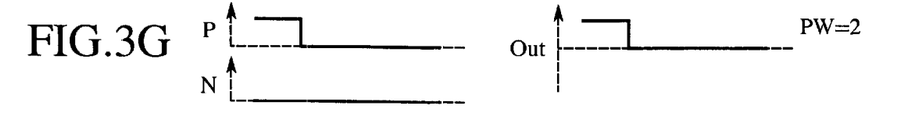
Figure 3H:
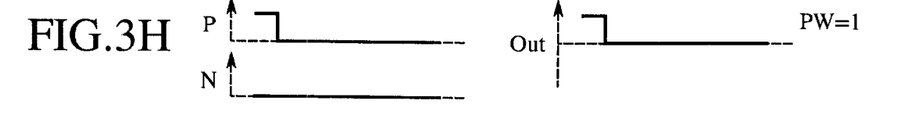
Figure 3I:
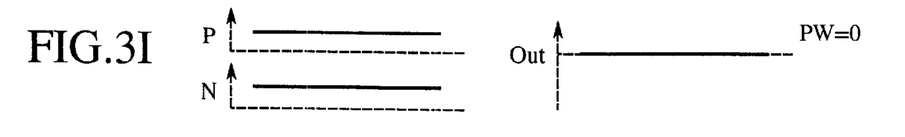
Figure 4A:
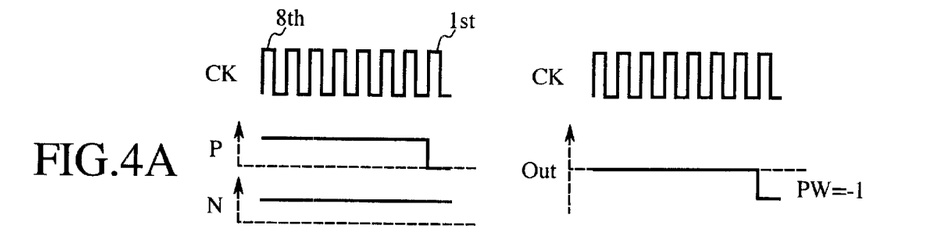
FIGS. 4(a)–4(h) are diagrams illustrating relationships between the basic clock pulse train CK, pulse signals P and N and PWM signal Out in the PWM converting circuit of FIG. 1.
Figure 4B:
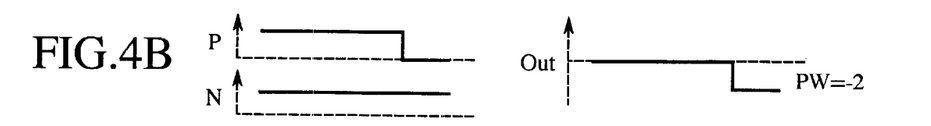
Figure 4C:
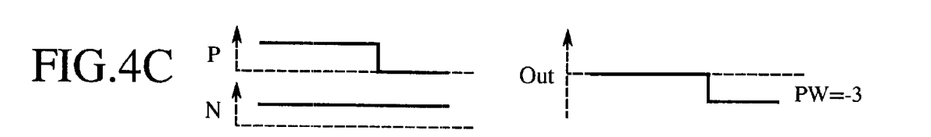
Figure 4D:
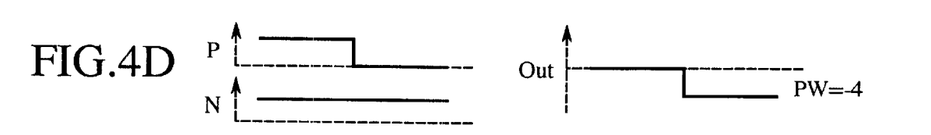
Figure 4E:
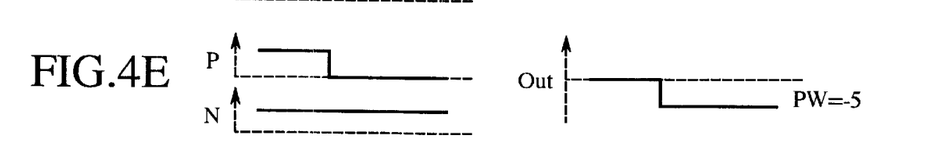
Figure 4F:
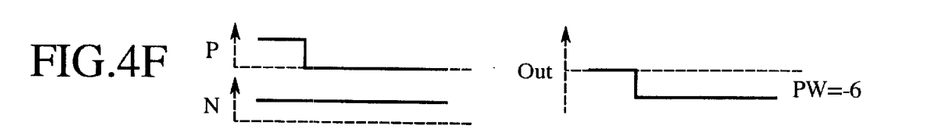
Figures 4G, 4H:
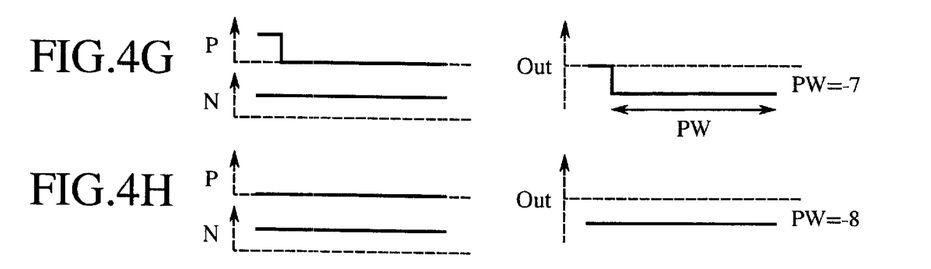

FIG. 2 is a table showing an example of the patters of the pulse signals P and N in the PWM converting circuit of FIG. 1; and FIGS. 3(a)–3(i) and 4(a)–4(h) are diagrams illustrating relationships between the basic clock pulse train CK, pulse signals P and N and PWM signal Out of the PWM converting circuit in FIG. 1. In these figures, the total number n of the pulses of the basic clock pulse train CK in one period of the PWM output pulse is assumed to be eight.

As shown on the left half of FIGS. 3(a)–3(i) and 4(a)–4(h), the pulse width (the number of high-level bits) of the pulse signal P varies on a bit-by-bit basis of the basic clock pulse train CK in response to the value of the digital data D. In contrast, the pulse signal N changes between a first state, in which all the eight bits are held at the low level (for the pulse width PW=+1 to +8), and a second state, in which all the eight bits are held at the high level (for pulse width PW=0 to −8 in response to the value of the digital data D). Thus, as shown on the right half of FIGS. 3(a)–3(i) and 4(a)–4(h), the pulse width PW of the PWM signal Out produced by the differential amplifier 3 varies from −8 to +8, thereby providing 17 patterns of the PWM signal Out at the maximum. In this case, the PWM signal the differential amplifier 3 outputs uses the reference potential of the differential amplifier as the reference.

In the conventional PWM converting circuit, since the pulse signals P and N are logically inverted to each other, the number of the output patterns of the PWM converting circuit is limited to n+1 at the maximum.

In contrast with this, the PWM converting circuit of FIG. 1 has 2n+1 output patterns of the PWM signal at the maximum, thereby nearly doubling it. Thus, the present embodiment 1 can improve its output resolution and dynamic range.

In addition, as for the PWM signal with the pulse width PW=+1 to +8, although the ratio of the high level in the pulse signal P gradually increases, the pulse signal N is maintained at the low level. Likewise, as for the PWM signal with the pulse width PW=−1 to −8, although the ratio of the low level of the pulse signal P gradually increases, the pulse signal N is maintained at the high level. Thus, the pulse signal N maintains its level except that it is switched from the low to high level and vice versa, thereby providing a stable output waveform.

As described above, the present embodiment 1 is configured such that it includes the pulse generator 1 for generating the pulse signals P and N taking either the low or high level for each pulse of the basic clock pulse train CK in response to the value of the digital data D, and the differential amplifier 3 for producing the differential amplification component between the pulse signals P and N as the PWM signal, and that the pulse generator 1 varies the pulse width of the pulse signal P on a bit-by-bit basis of the basic clock pulse train CK in response to the value of the digital data D, and maintains the level of the pulse signal N at either the low or high level over the entire bits of the basic clock pulse train CK during one period of the PWM output pulse. Therefore, the number of patterns of the PWM signal can be increased to 2n+1 for the total number n of the pulses of the basic clock pulse train CK in one period of the PWM output pulse. As a result, the present embodiment 1 offers an advantage of being able to increase the resolution and dynamic range of the PWM output signal.

Embodiment 2

The number of the output patterns of the pulse signals P and N in the PWM converting circuit in accordance with the present invention is not limited to that of the foregoing embodiment 1.

FIG. 5 is a table showing the output patters of the pulse signals P and N in the PWM converting circuit in accordance with the present invention. For comparison purposes, FIG. 5(a) shows the output patterns of the foregoing embodiment 1 already shown in FIG. 2.

Figure 5A:
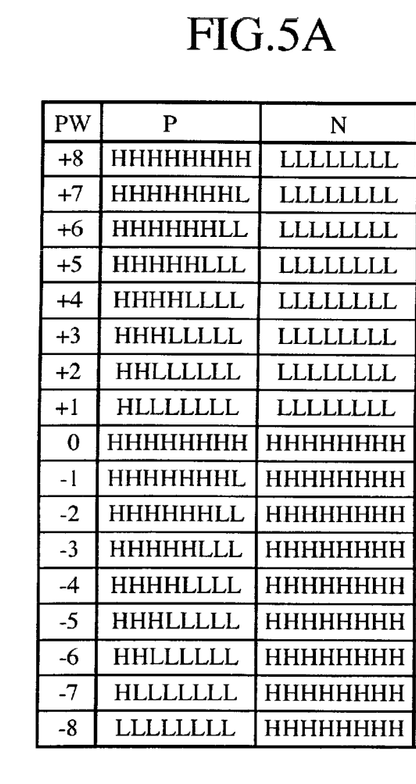
FIG. 5 is a table showing output patterns of the pulse signals P and N in the PWM converting circuit in accordance with the present invention.

As for the example of FIG. 5(a) (embodiment 1), the pulse generator 1 varies the pulse width of the pulse signal P, and holds the level of the pulse signal N at either the low or high level depending on the plus or minus side of the pulse width PW. In contrast, as for the example of FIG. 5(d), the pulse generator 1 holds the level of the pulse signal P at either the high or low level depending on the plus or minus side the pulse width PW, and varies the pulse width of the pulse signal N.

Figure 5B:
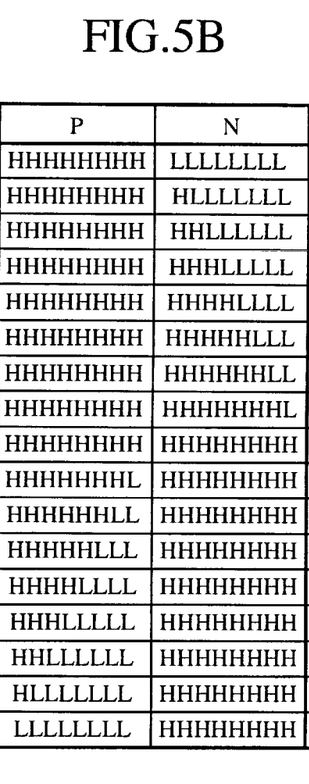
Figure 5C:
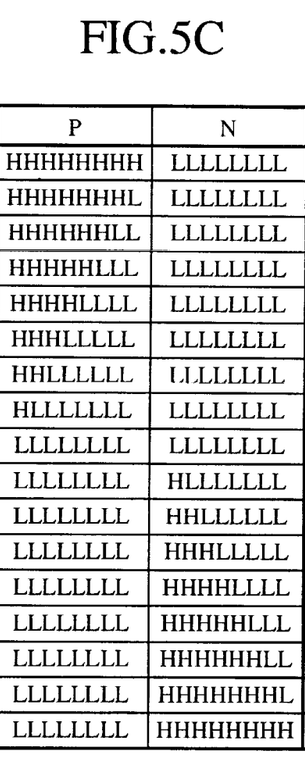
Figure 5D:
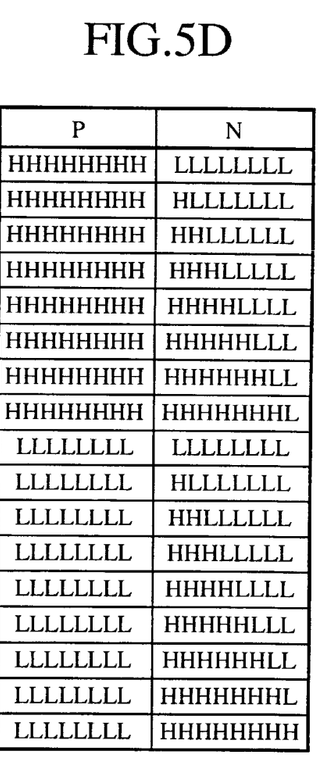
Figure 6A:
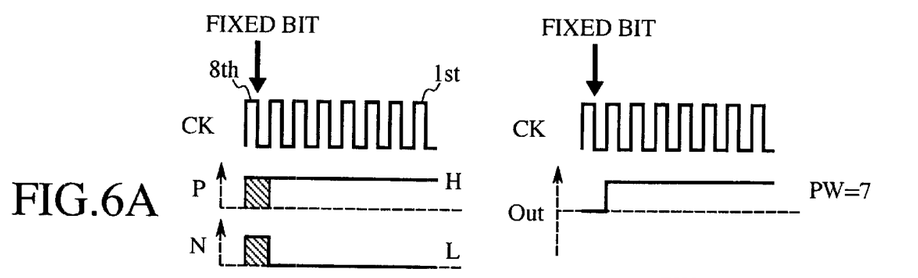
FIGS. 6(a)–6(h) are diagrams illustrating relationships between the basic clock pulse train CK, pulse signals P and N and PWM signal Out in an embodiment 3 of the PWM converting circuit in accordance with the present invention.
Figure 6B:
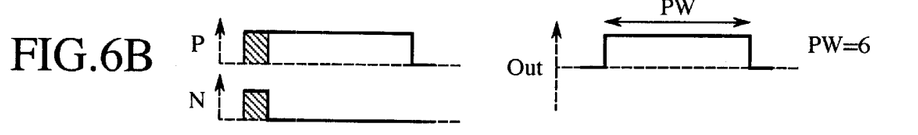
Figure 6C:
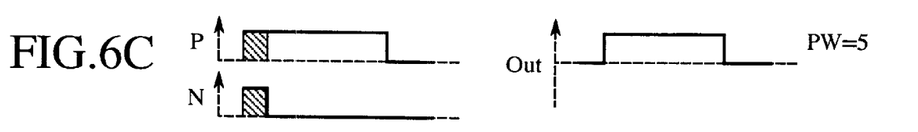
Figure 6D:
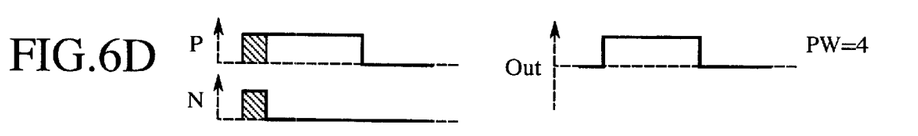
Figure 6E:
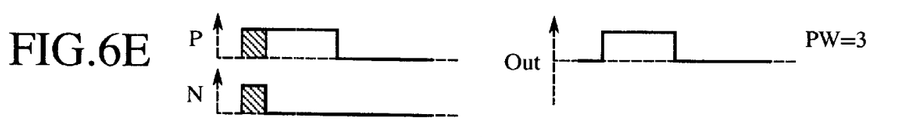
Figure 6F:
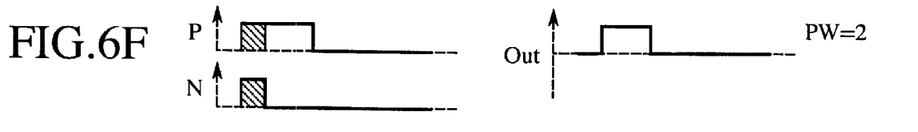
Figure 6G:
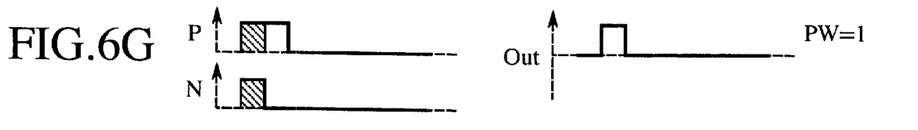
Figure 6H:
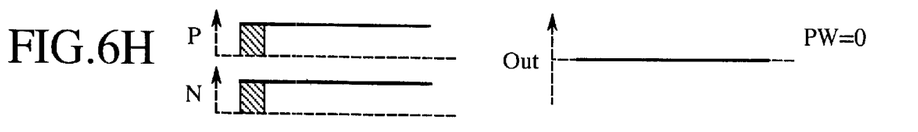
Figure 7A:
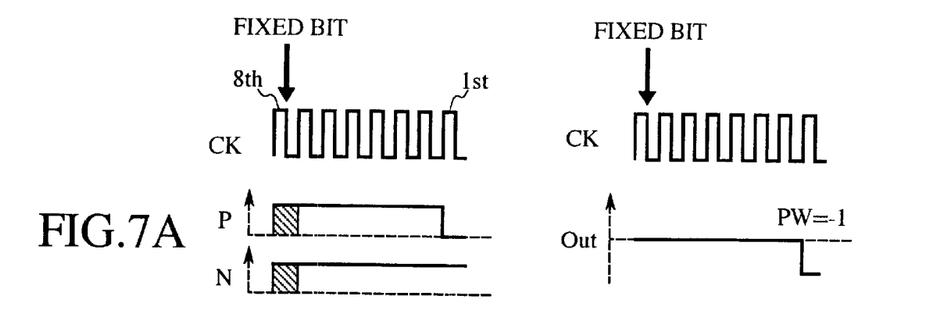
FIGS. 7(a)–7(g) are diagrams illustrating relationships between the basic clock pulse train CK, pulse signals P and N and PWM signal Out in the embodiment 3 of the PWM converting circuit in accordance with the present invention.
Figure 7B:
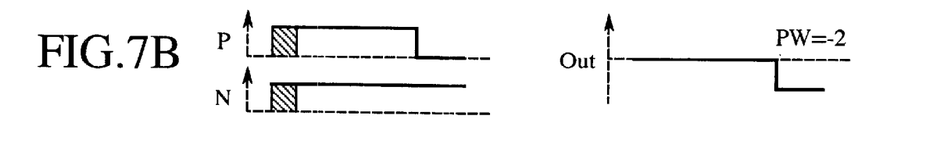
Figure 7C:
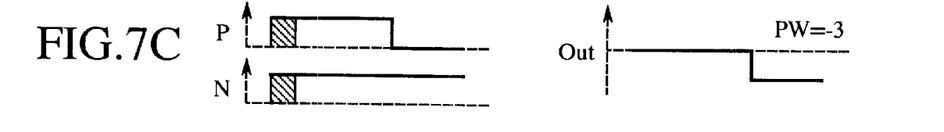
Figure 7D:
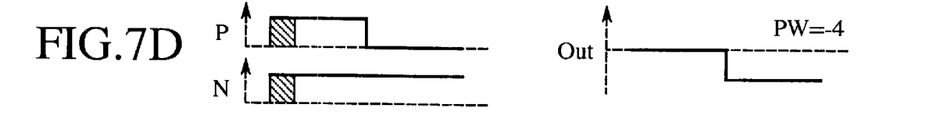
Figure 7E:
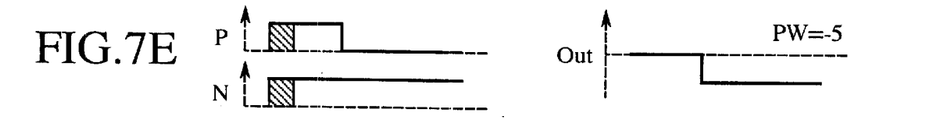
Figure 7F:
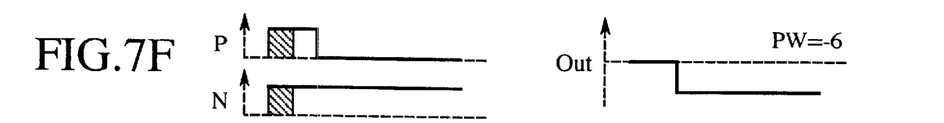
Figure 7G:
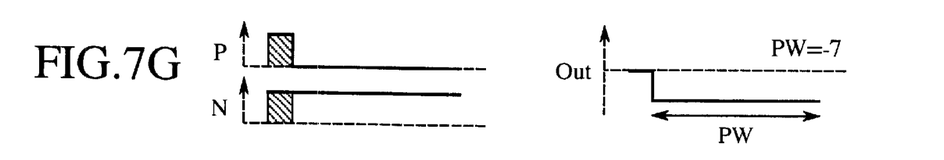
Figure 8A:
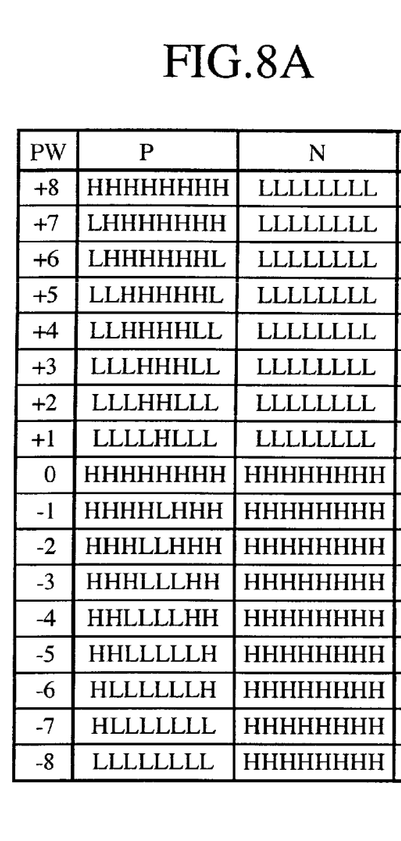
FIG. 8 is a table showing an example that varies the pulse widths of the pulse signals P and N by using the central bit of a clock pulse train within a PWM output pulse period as a reference.
Figure 8B:
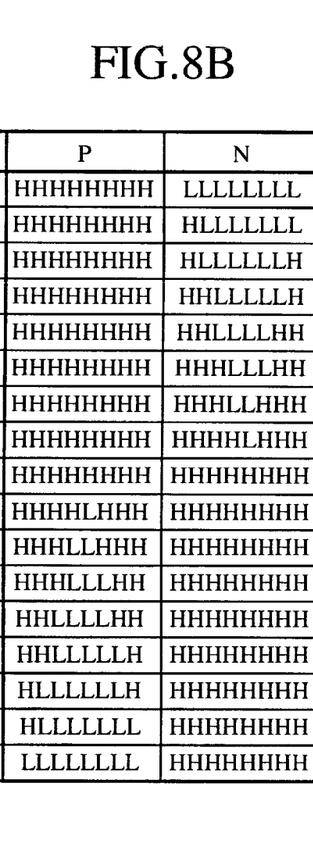
Figure 8C:
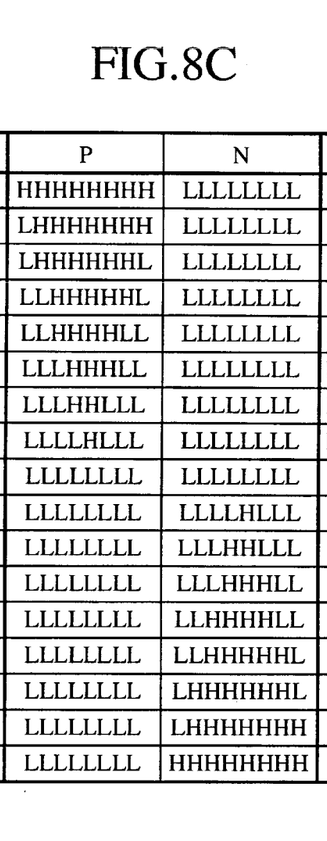
Figure 8D:
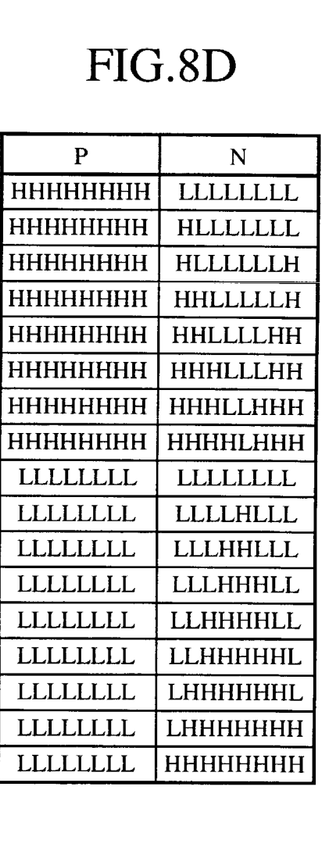

In addition, as for the case of FIG. 5(b), the pulse generator 1 holds the level of the pulse signal P at the high level and varies the pulse width of the pulse signal N on the plus side of the pulse width PW; and the pulse generator 1 switches from the pulse signal P to the pulse signal N that holds the level at the high level, and varies the pulse width of the pulse signal P on the minus side of the pulse width PW. Likewise, as for the case of FIG. 5(c), the pulse generator 1 holds the level of the pulse signal N at the low level, and varies the pulse width of the pulse signal P on the plus side of the pulse width PW; and the pulse generator 1 switches from the pulse signal N to the pulse signal P that holds the level at the low level, and varies the pulse width of the pulse signal N on the minus side of the pulse width PW.

All the examples of FIGS. 5(a)–5(d) result in the same PWM signal after the differential amplifier 3, offering the same advantages of the foregoing embodiment 1. However, since the output patterns of FIGS. 5(a) and 5(d) have fewer changes of the pulse signals P and N than those of FIGS. 5(b) and 5(c), they can provide more stable PWM signal output.

As described above, the present embodiment 2 is configured such that the pulse generator 1 selects one of the pulse signals P and N as a signal whose level is to be held, and switches the holding level from low to high and vice versa in response to the value of the digital data D. As a result, the present embodiment 2 can increase the number of patterns of the PWM signal to 2n+1 for the total number n of the pulses of the basic clock pulse train CK in one period of the PWM output pulse. Thus, it can offer an advantage of being able to improve the resolution and dynamic range of the PWM signal, and to output a stable PWM signal by reducing the changes of the pulse signals P and N.

Furthermore, the present embodiment 2 is configured such that the pulse generator 1 selects one of the low level and high level as a level to be hold, and switches the pulse signal whose level is to be held from the pulse signal P to the pulse signal N and vice versa in response to the value of the digital data D. As a result, the present embodiment 2 can increase the number of patterns of the PWM signal to 2n+1 for the total number n of the pulses of the basic clock pulse train CK in one period of the PWM output pulse. Thus, it can offer an advantage of being able to improve the output resolution and dynamic range of the PWM signal.

Embodiment 3

Any one of the bits of the pulse signals P and N (the same bit of each of the pulse signals P and N) can be selected as a fixed bit, the level of which is fixed to either the low or high level. This enables the fixed bit of the output of the differential amplifier 3 to assume a reference value without fail. As a result, even when the PWM signal changes from the plus to minus side and vice versa, the reference output appears between them, thereby suppressing sudden changes of the PWM signal, and reducing the waveform distortion.

FIGS. 6 and 7 are diagrams illustrating relationships between the basic clock pulse train CK, pulse signals P and N and PWM signal Out in an embodiment 3 of the PWM converting circuit in accordance with the present invention.

In FIGS. 6 and 7, the final bit of the basic clock pulse train CK is selected as the fixed bit, the level of which is fixed to the high level for both the pulse signals P and N. Thus, it is seen that the final bit of the PWM signal Out passing through the differential amplification always takes the reference value. Applying the fixed bit scheme will provide 15 output patterns from +7 to −7, when the total number n of the pulses of the basic clock pulse train CK during one period of the PWM output pulse is eight.

As described above, the present embodiment 3 is configured such that the pulse generator 1 selects any one of the bits of the basic clock pulse train CK as the fixed bit, and generates the pulse signals P and N with holding their fixed bits at the same level. Accordingly, the present embodiment 3 offers an advantage of being able to suppress sudden changes of the PWM signal, thereby reducing the waveform distortion.

Embodiment 4

The fixed bit is not limited to the final bit as in the foregoing embodiment 3. For example, the pulse generator 1 can select the initial bit or central bit of the pulse signals P and N as the fixed bit. Alternatively, it can select two bits as the fixed bits, such as the initial bit and final bit of the pulse signals P and N. This also makes it possible to suppress sudden changes of the PWM signal, thereby reducing the waveform distortion.

As described above, the present embodiment 4 is configured such that the pulse generator 1 selects one of the initial bit, central bit and final bit of the basic clock pulse train CK as the fixed bit. As a result, the present embodiment 4 offers an advantage of being able to suppress sudden changes of the PWM signal, thereby reducing the waveform distortion.

Furthermore, the present embodiment 4 is configured such that the pulse generator 1 selects two bits, the initial bit and final bit, of the basic clock pulse train CK as the fixed bits. Thus, it offers an advantage of being able to suppress the sudden changes of the PWM signal, thereby reducing the waveform distortion.

Embodiment 5

It is also possible, when varying the pulse width of the pulse signal P (or pulse signal N) in response to the value of the digital data D, to vary the pulse width using one of the initial bit, central bit and final bit of the basic clock pulse train CK as the reference.

As for the output patterns as shown in FIG. 5 of the foregoing embodiment 2, the pulse generator 1 varies the pulse width of the pulse signal P using the final bit as the reference. For example, as for the case of FIG. 5(a), the bits closer to the final bit undergo successive level changes from low to high to increase the pulse width of the pulse signal P, and the bits farther away from the final bit undergo successive level changes from high to low to reduce the pulse width of the pulse signal P. Thus, it varies the pulse width PW of the pulse signal P with respect to the final bit.

FIG. 8 shows an example that varies the pulse width of each of the pulse signals P and N using the central bit as the reference. In FIGS. 8(a)–8(d), using the central bit of the basic clock pulse train CK as the reference, the pulse generator 1 increases the pulse width by the successive level changes of the bits closer to the central bit from low to high, and reduces the pulse width by the successive level changes of the bits farther away from the central bit from high to low. Thus, the present embodiment 5 can generate an approximately symmetric PWM signal, thereby being able to produce a stable PWM signal.

As described above, the present embodiment 5 is configured such that the pulse generator 1 varies the pulse width of one of the pulse signals P and N with respect to the initial bit or final bit of the basic clock pulse train CK. As a result, it can increase the number of patterns of the PWM signal to 2n+1 for the total number n of the pulses of the basic clock pulse train CK in one period of the PWM output pulse. Thus, the present embodiment 5 offers an advantage of being able to improve its output resolution and dynamic range.

In addition, the present embodiment 5 is configured such that the pulse generator 1 varies the pulse width of one of the pulse signals P and N using the central bit of the basic clock pulse train CK as the reference. Thus, the present embodiment 5 can generate an approximately symmetric PWM signal, thereby being able to produce a stable PWM signal.

Combining the foregoing embodiments 1–5 can improve the computation accuracy and provide the PWM signal with smaller distortion or noise compared with the conventional PWM converting circuit that utilizes the pulse signal P and pulse signal N with inverted logical levels.

Figure 9:
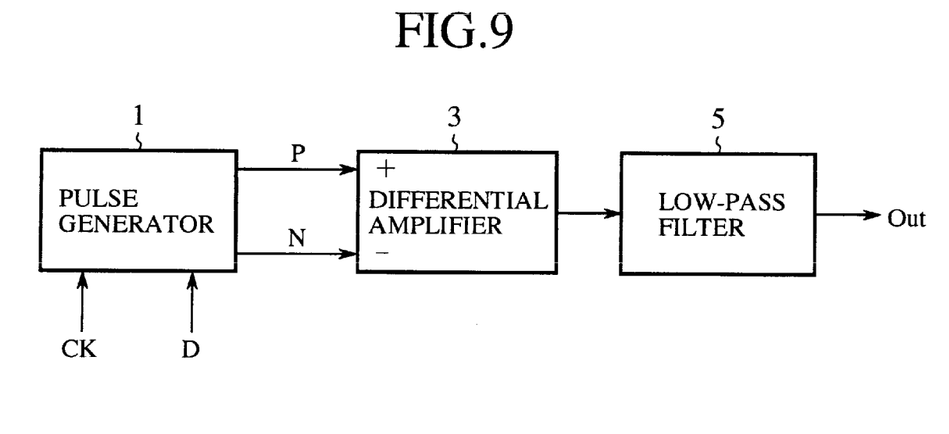
FIG. 9 is a block diagram showing a configuration of a D/A converter in accordance with the present invention.

The PWM converting circuit in accordance with the present invention is also applicable to a D/A converter. As shown in FIG. 9, the D/A converter can be constructed by combining the PWM converting circuit of the embodiments 1–5 with a low-pass filter 5 that carries out the waveform shaping of the PWM signal the PWM converting circuit outputs. This offers an advantage of being able to provide a D/A converter with an improved dynamic range.

What is claimed is:

1. A pulse width modulation (PWM) converting circuit that carries out PWM conversion of each value of digital input data for each bit of a basic clock pulse train, and outputs a result of the conversion as a PWM signal, said PWM converting circuit comprising:

a pulse generator for generating two pulse signals asserting one of a low level and a high level, for each bit of a basic clock pulse train in response to value of digital input data; and a differential amplifier for outputting a differential amplification component between the two pulse signals as the PWM signal, wherein said pulse generator varies pulse width of a first of the two pulse signals, on a bit-by-bit basis, of the basic clock pulse train, in response to the value of the digital input data, and holds a level of a second of the two pulse signals throughout the bits of the basic clock pulse train.

2. The PWM converting circuit according to claim 1, wherein said pulse generator holds a level of only one of the two pulse signals, and switches the level to be held between the low level and high level in response to the value of the digital input data.

3. The PWM converting circuit according to claim 1, wherein said pulse generator selects one of a low level and a high level as the level to be held, and selects a signal with a level to be held by switching between the two pulse signals.

4. The PWM converting circuit according to claim 1, wherein pulse generator selects any bit of each of the bits of the basic clock pulse train as a fixed bit, and generates the two pulse signals and fixes their fixed bits at an identical level.

5. The PWM converting circuit according to claim 4, wherein said pulse generator selects one of an initial bit, a central bit, and a final bit of each of the bits of the basic clock pulse train as the fixed bit.

6. The PWM converting circuit according to claim 4, wherein said pulse generator selects at least an initial bit and a final bit of each of the bits of the basic clock pulse train as fixed bits.

7. The PWM converting circuit according to claim 1, wherein said pulse generator varies the pulse width of one of the two pulse signals using one of an initial bit and a final bit of each of the bits of the basic clock pulse train as a reference.

8. The PWM converting circuit according to claim 1, wherein said pulse generator varies the pulse width of one of the two pulse signals using a central bit of each of the bits of the basic clock pulse train as a reference.

9. A digital-to-analog (D/A) converter comprising a pulse width modulation (PWM) converting circuit and a low-pass filter for waveform shaping of a PWM signal output from said PWM converting circuit, said PWM converting circuit carrying out PWM conversion of each value of digital input data for each bit of a basic clock pulse train, and outputting a conversion result as a PWM signal, said PWM converting circuit comprising:

a pulse generator for generating two pulse signals, asserting one of a low level and a high level, for each bit of a basic clock pulse train in response to value of digital input data; and a differential amplifier for outputting a differential amplification component between the two pulse signals as the PWM signal, wherein said pulse generator varies pulse width of a first of the two pulse signals, on a bit-by-bit basis, of the basic clock pulse train, in response to the value of the digital input data, and holds a level of a second of the two pulse signals throughout the bits of the basic clock pulse train.

10. A pulse width modulation (PWM) converting method PWM converting each value of digital input data for each bit of a basic clock pulse train, and outputs a conversion result as a PWM signal, said PWM converting method comprising:

generating two pulse signals, asserting one having a low level and one having a high level for each bit of a basic clock pulse train, in response to value of digital input data;

varying a pulse width of a first of the two pulse signals, on a bit-by-bit basis, of the basic clock pulse train, in response to the value of the digital input data;

holding a level of a second of the two pulse signals throughout the bits of the basic clock pulse train; and outputting a differential amplification component between the two pulse signals as the PWM signal.

* * * * *